(12) United States Patent
Chen et al.

(10) Patent No.: US 7,998,859 B2
(45) Date of Patent: Aug. 16, 2011

(54) SURFACE PREPARATION PROCESS FOR DAMASCENE COPPER DEPOSITION

(75) Inventors: Qingyun Chen, Branford, CT (US); Xuan Lin, Northford, CT (US); Vincent Paneccasio, Jr., Madison, CT (US); Richard Hurtubise, Clinton, CT (US); Joseph A. Abys, Guilford, CT (US)

(73) Assignee: Enthone Inc., West Haven, CT (US)

( * ) Notice: Subject to any disclaimer, the term of this patent is extended or adjusted under 35 U.S.C. 154(b) by 240 days.

(21) Appl. No.: 12/238,139

(22) Filed: Sep. 25, 2008

(65) Prior Publication Data
US 2010/0075496 A1    Mar. 25, 2010

(51) Int. Cl.
*H01L 21/00* (2006.01)
(52) U.S. Cl. .................................. 438/643; 438/653
(58) Field of Classification Search .......... 438/677, 438/678, 686, 687, 625–630, 642–644, 652–656
See application file for complete search history.

(56) References Cited

U.S. PATENT DOCUMENTS

| | | |
|---|---|---|
| 4,220,678 A | 9/1980 | Feldstein |
| 4,258,087 A | 3/1981 | Feldstein |
| 4,282,271 A | 8/1981 | Feldstein |
| 4,301,190 A | 11/1981 | Feldstein |
| 4,317,846 A | 3/1982 | Feldstein |
| 4,318,940 A | 3/1982 | Feldstein |
| 4,339,476 A | 7/1982 | Feldstein |
| 4,642,161 A | 2/1987 | Akahoshi et al. |
| 5,721,014 A | 2/1998 | Fakler et al. |
| 5,753,309 A | 5/1998 | Fakler et al. |
| 5,900,186 A | 5/1999 | Fakler et al. |
| 6,086,956 A | 7/2000 | Fakler et al. |
| 6,322,656 B1 | 11/2001 | Fakler et al. |
| 6,794,288 B1 | 9/2004 | Kolics et al. |
| 2004/0084773 A1 | 5/2004 | Johnston et al. |
| 2006/0240187 A1* | 10/2006 | Weidman .................. 427/248.1 |
| 2006/0246699 A1 | 11/2006 | Weidman et al. |
| 2006/0252252 A1 | 11/2006 | Zhu et al. |
| 2006/0264043 A1 | 11/2006 | Stewart et al. |
| 2007/0004201 A1 | 1/2007 | Lubomirsky et al. |
| 2007/0099422 A1 | 5/2007 | Wijekoon et al. |

OTHER PUBLICATIONS

Electroless Copper Deposition on Ruthenium for Damascene Interconnects; ECS Transactions; Q. Chen, X. Lin, C. Valverde, V. Paneccasio, R. Hurtubise, P. Ye, E. Kudrak, and J. Abys; Sep. 27, 2007.
211th ECS Abstract of Electroless Copper Deposition on Ruthenium for Damascene Interconnects; ECS Transactions; Q. Chen and X. Lin; et al.; Jan. 26, 2007.
PowerPoint Presentation: Electroless Copper Deposition on Ru for Damascene Interconnect Applications; Q. Chen, X. Lin, C. Valverde, V. Paneccasio, R. Hurtubise, P. Ye, E Kudrak, and J. Abys; ECS Meeting; May 9, 2007.

* cited by examiner

*Primary Examiner* — Richard A. Booth
(74) *Attorney, Agent, or Firm* — Senniger Powers LLP

(57) ABSTRACT

A method is disclosed for metallizing a substrate comprising an interconnect feature in the manufacture of a microelectronic device, wherein the interconnect feature comprises a bottom, a sidewall, and a top opening having a diameter, D. The method comprises the following steps: depositing a barrier layer on the bottom and the sidewall of the interconnect feature, the barrier layer comprising a metal selected from the group consisting of ruthenium, tungsten, tantalum, titanium, iridium, rhodium, and combinations thereof; contacting the substrate comprising the interconnect feature comprising the bottom and sidewall having the barrier layer thereon with an aqueous composition comprising a reducing agent and a surfactant; and depositing copper metal onto the bottom and the sidewall of the interconnect feature having the barrier layer thereon.

33 Claims, 7 Drawing Sheets

SURFACE PREPARATION PROCESS FOR DAMASCENE COPPER DEPOSITION

FIELD OF THE INVENTION

The present invention generally relates to a process for preparing the surface of a barrier layer and/or liner material for subsequent copper deposition in the manufacture of microelectronic devices.

BACKGROUND OF THE INVENTION

The demand for semiconductor integrated circuit (IC) devices such as computer chips with high circuit speed and high circuit density requires the downward scaling of feature sizes in ultra-large scale integration (ULSI) and very-large scale integration (VLSI) structures. The trend to smaller device sizes and increased circuit density requires decreasing the dimensions of interconnect features and increasing their density. An interconnect feature is a feature such as a trench or via formed in a dielectric substrate which is then filled with metal to yield an electrically conductive interconnect. Copper, having better conductivity than any metal except silver, is the metal of choice since copper metallization allows for smaller features and uses less energy to pass electricity.

A conventional semiconductor manufacturing process is the damascene system. The damascene process begins by etching the circuit architecture into the substrate's dielectric material. The architecture is comprised of a circuitry pattern comprising a combination of the aforementioned trenches and vias. In the context of semiconductor integrated circuit device manufacture, substrates include semiconductor wafers and chips, typically silicon wafers and silicon chips, although other semiconductor materials, such as gallium arsenide are used as well. A dielectric film, such as, for example, $SiO_2$ or low-κ dielectrics, is typically deposited by conventional methods on the surface of the semiconductor wafer or chip and then etched, by conventional lithography, to achieve the circuitry pattern.

Next, a barrier layer is laid over the dielectric film having the patterned circuit architecture therein to prevent diffusion of the subsequently applied copper layer into the substrate's junctions. The barrier layer is deposited since copper has a tendency to diffuse into the semiconductor's junctions, thereby disturbing their electrical characteristics. The barrier layer typically includes a refractory metal nitride and/or silicide, such as titanium or tantalum. Of this group, tantalum nitride is one of the most desirable materials for use as a barrier layer. Tantalum nitride has one of the lowest electrical resistivities of the metal nitrides and is also a good barrier to prevent copper diffusion, even when relatively thin layers are formed (e.g., about 20 angstroms or less). A tantalum nitride layer is typically deposited by conventional deposition techniques, such as physical vapor deposition (PVD), atomic layer deposition (ALD) or chemical vapor deposition (CVD).

Tantalum nitride has negative characteristics, which include poor adhesion to the copper layer deposited thereon. Poor adhesion of the subsequently deposited copper layers can lead to poor electromigration in the formed device and possibly cause process contamination issues in subsequent processing steps, such as during a chemical mechanical polishing (CMP) process. A tantalum nitride layer exposed to oxygen sources or other contaminants may cause the exposed surface of the tantalum nitride layer to oxidize thus preventing the formation of a strong bond to the subsequently deposited copper layer. The interface between a tantalum nitride barrier layer and a copper layer is likely to separate during a standard tape test.

Deposition of the barrier layer may be followed by physical or chemical vapor deposition of a copper seed layer to provide electrical conductivity for a sequential electrochemical process. Conventional PVD copper seeding may not be extendible to 22 nm technology node or beyond. Chemical seeding alternatives and direct plating on barriers such as Ta/TaN, Ti/Ti/N, W/WN or ruthenium materials have been investigated in recent years to achieve conformal step coverage. However, adhesion of copper deposits through direct electrochemical plating processes on those resistive barriers other than ruthenium is an issue. Even though ruthenium may not be an effective barrier, it is a promising alternative seed layer because it has excellent adhesion to both copper and the underlying barrier layer, and it also provides the feasibility of direct electrolytic deposition or electroless deposition.

Although ruthenium is a fairly conductive material, its sheet resistance at nano-scale thickness is still too high to be electrolytically plated uniformly. Global uniformity of electrolytic copper deposition (ECP) on ruthenium is currently unacceptable due to significant degree of terminal effect. PVD copper flash and other processes have been explored for possible reduction of terminal effect. Electroless copper deposition is an attractive alternative to warrant uniform seed coverage locally and globally for sequential electrochemical copper gapfill, and possibly to achieve direct void-free gapfill on ruthenium substrates.

After deposition of barrier layer and seeding, vias and trenches that define the circuit architecture are filled with copper by plating (such as electroless and electrolytic), sputtering, plasma vapor deposition (PVD), and chemical vapor deposition (CVD). It is generally recognized that electrolytic deposition is the best method to apply copper since it is more economical than other deposition methods and can flawlessly fill into the interconnect features (often called "bottom up" growth). After the copper layer has been deposited, excess copper is removed from the facial plane of the dielectric by chemical mechanical polishing, leaving copper in only the etched interconnect features of the dielectric. Subsequent layers are produced similarly before assembly into the final semiconductor package.

SUMMARY OF THE INVENTION

Briefly, the present invention is directed to a method of metallizing a substrate comprising an interconnect feature in the manufacture of a microelectronic device, wherein the interconnect feature comprises a bottom, a sidewall, and a top opening having a diameter, D. The method comprises depositing a barrier layer on the bottom and the sidewall of the interconnect feature, the barrier layer comprising a metal selected from the group consisting of ruthenium, tungsten, tantalum, titanium, iridium, rhodium, and combinations thereof; contacting the substrate comprising the interconnect feature comprising the bottom and sidewall having the barrier layer thereon with an aqueous composition comprising a reducing agent; and depositing copper metal onto the bottom and the sidewall of the interconnect feature having the barrier layer thereon.

Other objects and features will be in part apparent and in part pointed out hereinafter.

BRIEF DESCRIPTION OF THE DRAWINGS

Corresponding reference characters indicate corresponding parts throughout the drawings.

DESCRIPTION OF THE EMBODIMENT(S) OF THE INVENTION

Figure 1:
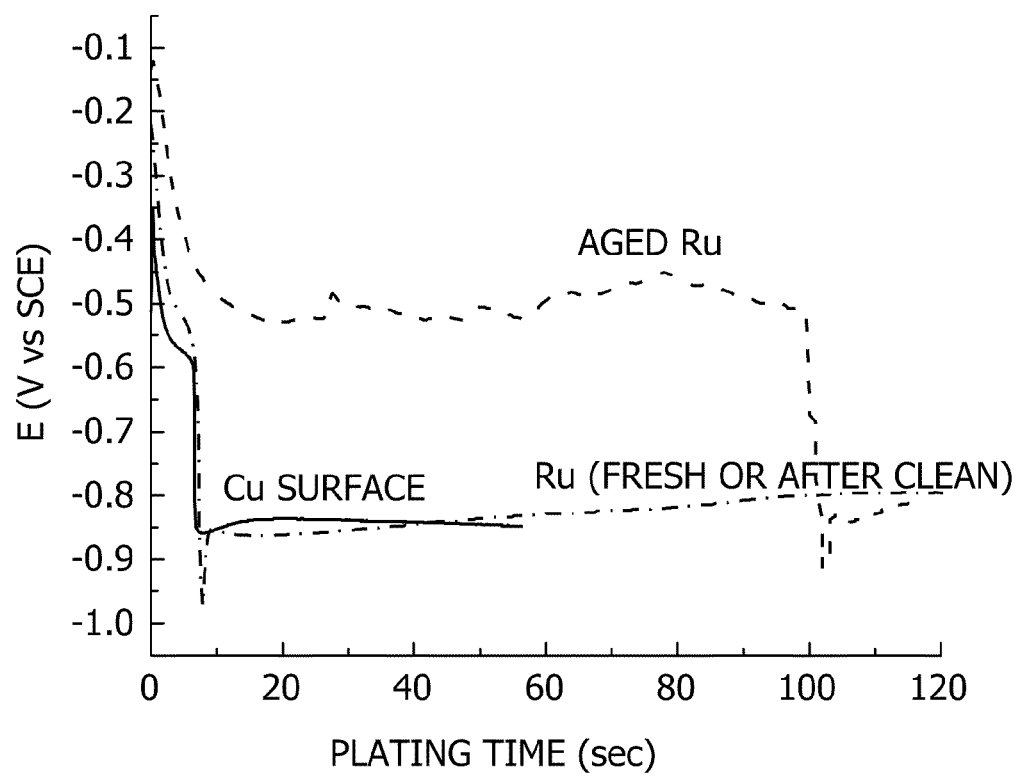
FIG. 1 is a graph showing the induction time of an electroless copper deposition process on ruthenium substrates (freshly prepared and aged) and on a PVD copper substrate. Data used to prepare the graph were obtained according to the method of Example 3.

The present invention is directed to a method of improving the deposition of metal, such as copper, cobalt, or nickel, on a barrier layer or liner material, such as ruthenium or tungsten, in the manufacture of a microelectronic device. In one embodiment, the method of the present invention improves superfilling of an interconnect feature in a semiconductor integrated circuit device substrate with copper by enhancing nucleation uniformity and decreasing surface roughness. In this regard, the method of the present invention reduces barrier metal surface oxides that may form on the surface of the barrier metal, typically ruthenium, upon exposure to air prior to copper deposition. In another embodiment, the method of the present invention enhances the deposition of cobalt or nickel on a tungsten layer for use in filling vias in stacked memory devices with cobalt or nickel metallization or applying a thin coating layer of cobalt or nickel on tungsten.

A semiconductor integrated circuit device substrate, i.e., a wafer or die, has a front surface and a back surface. The front surface is the surface in which integrated circuitry is built. Accordingly, the interconnect feature, i.e., trench or via, is located in the front surface of the semiconductor substrate. The feature has an opening in the front surface of the substrate, a sidewall extending from the front surface of the substrate, and a bottom. In a conventional damascene process, additional layers of dielectric are typically deposited on top of a filled feature, and the additional dielectric layers are patterned to comprise interconnect features including trenches and via that may be metallized according to the method of the present invention.

Interconnect features are metal traces that provide conductivity between devices built in a dielectric substrate (trench) or between layers of circuitry (via). Devices include transistors, capacitors, etc. in memory cells and logic gates. Typical interconnect opening dimensions, i.e., diameter of a via opening or width of a trench, in sub-micron sized features having high aspect ratios, are typically less than about 600 nm, but more typically range from about 350 nm to about 1 nm. The opening dimensions are generally less than about 200 nm, less than about 150 nm, less than about 100 nm, or even less than about 50 nm. Generally, the opening dimensions are greater than about 1 nm, such as at least about 10 nm. The depth of a feature, which may be determined by the length of the sidewall or alternatively by the shortest transverse dimension between the plane of the feature opening and the plane of the feature bottom, is generally at least about 10 nm, but more typically range from about 100 nm to about 1000, such as about 300 nm. In view of these opening and depth dimensions, interconnect features may be characterized as having aspect ratios in terms of depth:opening from about 0.1:1 to about 30:1, such as from about 0.5:1 to about 30:1, or between about 1:1 and about 20:1, typically between about 2:1 and about 10:1, more typically from about 3:1 to about 6:1, such as from about 3:1 to about 4:1.

These features are located in a patterned dielectric film, the dielectric film located on a semiconductor substrate. The semiconductor substrate may be, for example, a semiconductor wafer or chip. The semiconductor wafer is typically a silicon wafer or silicon chip, although other semiconductor materials, such as germanium, silicon germanium, silicon carbide, silicon germanium carbide, and gallium arsenide are applicable to the method of the present invention.

The semiconductor substrate has deposited thereon a dielectric (insulative) film, such as, for example, $SiO_2$, silicon nitride, silicon oxynitride, carbon-doped silicon oxides, or low-κ dielectrics. The dielectric film is typically deposited by conventional methods on the surface of the semiconductor wafer or chip and then patterned by conventional lithography, to achieve the circuitry pattern comprising the aforementioned vias and trenches. Low-κ dielectric refers to a material having a dielectric constant less than that of silicon dioxide (dielectric constant of $SiO_2$=3.9). Low-κ dielectric materials are desirable since such materials exhibit reduced parasitic capacitance compared to the same thickness of $SiO_2$ dielectric, enabling increased feature density, faster switching speeds, and lower heat dissipation. Low-κ dielectric materials can be categorized by type (silicates, fluorosilicates and organo-silicates, organic polymeric etc.) and by deposition technique (CVD; spin-on). Dielectric constant reduction may be achieved by reducing polarizability, by reducing density, or by introducing porosity.

In one embodiment, the method of the present invention for the metallization of interconnect features located in semiconductor substrates comprises the following steps: (1) depositing a barrier metal layer on the bottom and the sidewall of an interconnect feature, (2) cleaning the barrier metal layer and in particular reducing surface barrier metal oxides to barrier metal with a composition comprising a reducing agent and a solvent, and (3) filling the feature with copper, cobalt, or nickel metallization by depositing such metallization onto the cleaned barrier layer using electroless deposition, electrolytic deposition, or a combination thereof.

Barrier layer and liner materials may be selected from among ruthenium, tungsten, tantalum, tantalum nitrogen composite, titanium, titanium nitrogen composite, tungsten, and tungsten nitrogen composite, ruthenium, iridium, and rhodium, among others. Barrier layers comprising these materials effectively block copper diffusion into the semiconductor's junctions and thereby maintain the integrity of the copper fill. These diffusion barriers may be deposited onto the bottom and sidewalls of the interconnect feature by methods known in the art, such as physical vapor deposition (PVD), plasma-enhanced physical vapor deposition (PE-PVD), chemical vapor deposition (CVD), plasma-enhanced chemical vapor deposition (PE-CVD), and atomic layer deposition (ALD). The diffusion barrier layer is typically deposited to a thickness between about 5 nm and about 500 nm, more typically to a thickness between about 10 nm and about 250 nm.

In one embodiment, the barrier layer may comprise one or more than one (i.e., two, three, four, or more) distinctive layers. For example, the barrier layer may be formed by depositing a tantalum layer within the features in the dielectric layer, followed by nitridization in an ammonium or nitrogen containing atmosphere, which may yield a surface tantalum nitride layer. In another example, tantalum may be deposited first, followed by deposition of a separate tantalum nitride layer. In yet another example, the barrier layer may comprise a first layer of tantalum or tantalum nitride and a second layer comprising ruthenium.

In another embodiment, the barrier layer may comprise a first layer of titanium/titanium nitride and a second layer of ruthenium. In yet another embodiment, the first layer of the barrier layer may be tantalum/tantalum nitride, and the second layer may be iridium. In still another embodiment, the first layer may be tantalum/tantalum nitride and the second layer may be rhodium.

Many diffusion barrier layers constructed of conventional materials typically do not provide adequate adhesion to directly deposited copper metallization. Accordingly, in one embodiment of the present invention, the diffusion barrier layer further comprises a seed layer deposited on top of an underlying diffusion barrier material, the seed layer forming a surface for direct copper metallization that has better adhesion to the copper metallization than conventional diffusion barrier layers. The seed layer in this embodiment may comprise a material selected from among ruthenium, tungsten, iridium, rhodium, or platinum or composites, such as ruthenium-platinum and ruthenium-platinum-carbon. In one embodiment, the seed layer comprises at least about 50 wt. % ruthenium, preferably at least about 80 wt. % ruthenium, even more preferably at least about 95 wt. % ruthenium. In one embodiment, the seed layer essentially comprises ruthenium, which may be deposited by PVD, CVD, or ALD, (and plasma enhanced methods thereof). In one embodiment, the seed layer comprises at least about 50 wt. % tungsten, preferably at least about 80 wt. % tungsten, even more preferably at least about 95 wt. % tungsten. In one embodiment, the seed layer essentially comprises tungsten, which may be deposited by PVD, CVD, or ALD, (and plasma enhanced methods thereof). While other materials may be present in the barrier layer in small amounts, these are typically considered impurities, and thus are present in amounts of less than about 2 wt. %, more preferably less than about 1 wt. %. Typically, the seed layer is deposited to a thickness between about 1 nm and about 200 nm, more preferably to a thickness between about 2 nm and about 10 nm.

After the barrier layer is deposited, the substrate may be contacted with an aqueous composition comprising a reducing agent. Preferably, the aqueous composition further comprises a surfactant. The pH may be adjusted to an alkaline pH and buffered using buffering agents. Optionally, a completing agent may be added to the aqueous composition. Aged barrier layer materials are susceptible to the formation of surface metal oxides. Surface metal oxides are disadvantageous since metal oxides may impair adhesion between the barrier layer and subsequently applied metallization, may cause non-uniform nucleation during metal deposition which may thereby cause voids to form in the deposit, and may inhibit induction of metallization on the barrier layer surface which may prevent metal from depositing in the feature altogether. Even a thin layer of ruthenium oxide formation on a ruthenium barrier layer (e.g., less than about 10 Angstroms) may initiate non-uniform, isolated copper nucleation during a subsequent electroless copper deposition process, thereby leading to voids and non-plating defects and cause increased copper surface roughness compared to copper nucleation and smooth copper growth on a "fresh" ruthenium substrate. A thin layer of surface oxide may form as quickly as a few hours within deposition of the barrier layer in ambient temperatures and atmospheres. Treating the barrier layer in the composition of the present invention to reduce surface oxides prior to metallization improves adhesion between the barrier layer and the subsequent metallization deposit, improves electroless nucleation uniformity and density, improves surface roughness of the deposited metal layer, and improves the appearance of the deposited metal layer.

The aqueous composition for use in the cleaning method of the present invention comprises a reducing agent. The reducing agent may be a borane-based reducing agent, a phosphorus-based reducing agent, glyoxylic acid, a hydrazine-based reducing agent, or combinations thereof.

Borane-based reducing agents include borohydrides (sodium, potassium, cyano, trimethoxy, and tetramethylammonium, among others), monomethyl amine borane, isopropyl amine borane, tert-butylamine borane, dimethyl amine borane (DMAB), diethyl amine borane (DEAB), trimethyl amine borane, triethyl amine borane, triisopropyl amine borane, pyridine borane, morpholine borane, 4-methylmorpholine borane, among others. To ensure that a sufficient concentration of borane is present in the composition for adequate surface oxide reduction, the source of borane may be added in an initial concentration from about 0.01 M to about 5 M, such as from about 0.1 M to about 2 M, such as from about 0.1 M to about 1.5 M, such as about 0.3 M to about 1 M.

Phosphorus-based reducing agents include hypophosphorus acid, ammonium hypophosphite, sodium hypophosphite, sodium hypophosphite monohydrate, potassium hypophosphite, tetramethylammonium hypophosphite, tetraethylammonium hypophosphite, tetrapropylammonium hypophosphite, tetrabutylammonium hypophosphite, calcium hypophosphite, manganese hypophosphite, 1-ethylpiperidine hypophosphite, anilinium hypophosphite, among others. To ensure that a sufficient concentration of hypophosphite is present in the composition for adequate surface oxide reduction, the source of hypophosphite may be added in an initial concentration from about 0.01 M to about 10 M, such as from about 0.1 M to about 5 M, such as from about 0.5 M to about 2 M, such as about 1 M.

Hydrazine-based reducing agents include sources of hydrazine or hydrazine derivatives that introduce free hydrazine upon dissolution. Examples of preferred sources of hydrazine include hydrazine, hydrazine hydrate, hydrazine sulfate, hydrazine chloride, hydrazine bromide, hydrazine dihydrochloride, hydrazine dihydrobromide and hydrazine tartrate. These sources are preferred in certain embodiments of the invention because they provide hydrazine directly upon dissolution. Other suitable sources of hydrazine include 2-hydrazinopyridine, hydrazobenzene, phenyl hydrazine, hydrazine-N,N-diacetic acid, 1,2-diethylhydrazine, monomethylhydrazine, 1,1-dimethylhydrazine, 1,2-dimethylhydrazine, 4-hydrazinobenzenesulfonic acid, hydrazinecarboxylic acid, 2-hydrazinoethanol, semicarbazide, carbohydrazide, aminoguanidine hydrochloride, 1,3-diaminoguanidine monohydrochloride, and triaminoguanidine hydrochloride. These sources provide hydrazine as a reaction product. The source of hydrazine may be added in an initial concentration from about 0.01 M to about 5 M, such as from about 0.1 M to about 1 M, such as about 0.5 M.

Glyoxylic acid may be added as glyoxylic acid itself, as a monohydrate, or as a salt, such as sodium glyoxylate monohydrate, or potassium glyoxylate. The source of glyoxylic acid may be added in an initial concentration from about 0.01 M to about 5 M, such as from about 0.1 M to about 1 M, such as about 0.5 M.

The reducing agent may comprise a combination of the above-described reducing agents. For example, in one embodiment, the reducing agent may comprise a combination of a borane-based reducing agent and a phosphorus-based reducing agent. For example, in one preferred embodiment, the reducing agent comprises dimethylamine borane, present in a concentration of about 0.2 M and hypophosphite, present in a concentration between about 0.5 M and about 2 M.

The reducing agent composition may be formulated as aqueous solutions. The term "aqueous," as used herein, refers to compositions comprising water in an amount that renders it the predominant solvent. "Aqueous" is not intended to exclude the presence of nonaqueous (i.e., organic) solvents, as long as water is present. Examples of suitable nonaqueous solvents include toluene, xylenes, petroleum naphtha, tetrahydrofurfuryl alcohol, ethylene glycol, polyethylene glycol, propylene glycol, ethanol, and hexanol.

Surfactants may be added to promote wetting of barrier layers in interconnect feature and for uniformity improvement. Surfactants useful in the reducing agent composition may be anionic, cationic, or non-ionic.

Exemplary anionic surfactants include alkyl phosphonates, alkyl ether phosphates, alkyl sulfates, alkyl ether sulfates, alkyl sulfonates, alkyl ether sulfonates, carboxylic acid ethers, carboxylic acid esters, alkyl aryl sulfonates, aryl alkylether sulfonates, aryl sulfonates, and sulfosuccinates. Anionic surfactants include any sulfate ester, such as those sold under the trade name Genapol (from Clariant, including Genapol LRO liquid, Genapol LRO paste, Genapol NH, Genapol LSA/LRA, Genapol LSS/S28, Genapol LST 40, Genapol XRO, etc.), and Triton (from Dow Chemical, including Triton QS-15 and Triton W-30). Anionic sulfate-esters include: sodium lauryl sulfate, sodium laureth sulfate (1 EO), sodium laureth sulfate (2 EO), sodium laureth, sodium laureth sulfate (3 EO), ammonium lauryl sulfate, ammonium laureth sulfate, ammonium laureth sulfate (3 EO) (available under the trade name CALFOAM® EA-603 from Pilot Chemical Company), TEA-lauryl sulfate, TEA-laureth sulfate, MEA-lauryl sulfate, MEA-laureth sulfate, potassium lauryl sulfate, potassium laureth sulfate, sodium decyl sulfate, sodium octyl/decyl sulfate, sodium 2-ethylhexyl sulfate, sodium octyl sulfate, sodium nonoxynol-4 sulfate, sodium nonoxynol-6 sulfate, sodium cumene sulfate, ammonoium nonoxynol-6 sulfate, and polyether sulfates. Also applicable are sulfonate esters such as sodium α-olefin sulfonate, ammonium xylene sulfonate, sodium xylene sulfonate, sodium toluene sulfonate, dodecyl benzene sulfonate, and lignosulfonates; sulfosuccinate surfactants such as disodium lauryl sulfosuccinate, disodium laureth sulfosuccinate. Still other anionic surfactants include sodium cocoyl isethionate, lauryl phosphate, any of the ULTRAPHOS series of phosphate esters, Cyastat® 609 (N,N-Bis(2-hydroxyethyl)-N-(3'-Dodecyloxy-2'-Hydroxypropyl) Methyl Ammonium Methosulfate) and Cyastat® LS ((3-Lauramidopropyl)trimethylammonium methylsulfate), available from Cytec Industries. Additional phosphate esters include Triton H-55, Triton H-66, Triton QS-44, and Triton XQS-20, available from Dow Chemical. A particularly preferred anionic surfactant is Ralufon NAPE 14-90 (available from Raschig GmbH, Ludwigshafen, Germany) which is a sulfonated β-naphthol propoxylate/ethoxylate having a block of propylene oxide units bonded to the β-naphthol hydroxyl group, a block of ethylene oxide units bonded to the propylene oxide block, and a terminal propane sulfonate group.

Exemplary cationic surfactants include quaternary ammonium salts such as dodecyl trimethyl ammonium chloride, cetyl trimethyl ammonium salts of bromide and chloride, hexadecyl trimethyl ammonium salts of bromide and chloride, alkyl dimethyl benzyl ammonium salts of chloride and bromide, and the like. Preferred quaternary ammonium surfactants are sold under the trade name Dodigen by Clariant, including Dodigen 226 (cocoalkyl dimethyl benzyl ammonium chloride), Dodigen 228 LF (dodecyl dimethyl benzyl ammonium chloride), and Dodigen 1611 (alkyl dimethyl benzyl ammonium chloride). Additional quaternary surfactants include Lodyne 106A (Fluoroalkyl Ammonium Chloride Cationic Surfactant 28-30%) and Ammonyx 4002 (Octadecyl dimethyl benzyl ammonium chloride Cationic Surfactant) are particularly preferred.

In one embodiment, the surfactant is non-ionic. A class of non-ionic surfactants includes those comprising polyether groups, based on, for example, ethylene oxide (EO) repeat units and/or propylene oxide (PO) repeat units. These surfactants are typically non-ionic. Surfactants having a polyether chain may comprise between about 1 and about 36 EO repeat units, between about 1 and about 36 PO repeat units, or a combination of between about 1 and about 36 EO repeat units and PO repeat units. More typically, the polyether chain comprises between about 2 and about 24 EO repeat units, between about 2 and about 24 PO repeat units, or a combination of between about 2 and about 24 EO repeat units and PO repeat units. Even more typically, the polyether chain comprises between about 6 and about 15 EO repeat units, between about 6 and about 15 PO repeat units, or a combination of between about 6 and about 15 EO repeat units and PO repeat units. These surfactants may comprise blocks of EO repeat units and PO repeat units, for example, a block of EO repeat units encompassed by two blocks of PO repeat units or a block of PO repeat units encompassed by two blocks of EO repeat units. Another class of polyether surfactants comprises alternating PO and EO repeat units. Within these classes of surfactants are the polyethylene glycols, polypropylene glycols, and the polypropylene glycol/polyethylene glycols.

Yet another class of non-ionic surfactants comprises EO, PO, or EO/PO repeat units built upon an alcohol or phenol base group, such as glycerol ethers, butanol ethers, pentanol ethers, hexanol ethers, heptanol ethers, octanol ethers, nonanol ethers, decanol ethers, dodecanol ethers, tetradecanol ethers, phenol ethers, alkyl substituted phenol ethers, α-naphthol ethers, and β-naphthol ethers. With regard to the alkyl substituted phenol ethers, the phenol group is substituted with a hydrocarbon chain having between about 1 and about 10 carbon atoms, such as about 8 (octylphenol) or about 9 carbon atoms (nonylphenol). The polyether chain may comprise between about 1 and about 24 EO repeat units, between about 1 and about 24 PO repeat units, or a combination of between about 1 and about 24 EO and PO repeat units. More typically, the polyether chain comprises between about 8 and about 16 EO repeat units, between about 8 and about 16 PO repeat units, or a combination of between about 8 and about 16 EO and PO repeat units. Even more typically, the polyether chain comprises about 9, about 10, about 11, or about 12 EO repeat units; about 9, about 10, about 11, or about 12 PO repeat units; or a combination of about 9, about 10, about 11, or about 12 EO repeat units and PO repeat units.

An exemplary β-naphthol derivative non-ionic surfactant is Lugalvan BNO12 which is a β-naphtholethoxylate having 12 ethylene oxide monomer units bonded to the naphthol hydroxyl group. A similar surfactant is Polymax NPA-15, which is a polyethoxylated nonylphenol. Polyethoxylated nonylphenols are also sold under the Tergitol® trade name by Dow Chemical, and include Tergitol® NP-4, Tergitol® NP-6, Tergitol® NP-7, Tergitol® NP-8, Tergitol® NP-9, Tergitol® NP-10, Tergitol® NP-11, Tergitol® NP-12, Tergitol® NP-13, Tergitol® NP-15, and Tergitol® NP-30. Another surfactant is Triton®-X100 nonionic surfactant, which is an octylphenol ethoxylate, typically having around 9 or 10 EO repeat units. Additional commercially available non-ionic surfactants include the Pluronic® series of surfactants, available from BASF. Pluronic® surfactants include the P series of EO/PO block copolymers, including P65, P84, P85, P103, P104, P105, and P123, available from BASF; the F series of EO/PO block copolymers, including F108, F127, F38, F68, F77, F87, F88, F98, available from BASF; and the L series of EO/PO block copolymers, including L10, L101, L121, L31, L35, L44, L61, L62, L64, L81, and L92, available from BASF. Another class of nonionic polyether surfactants includes low foaming surfactants, such as the Triton CF series, including Triton CF-10, Triton CF-21, Triton CF-32, Triton CF-76, Triton CF-87 and the Triton DF series, including Triton DF-12, Triton DF-16, Triton DF-18, and Triton DF-20.

Additional commercially available non-ionic surfactants include water soluble, ethoxylated nonionic fluorosurfactants available from DuPont and sold under the trade name Zonyl®, including Zonyl® FSN (Telomar B Monoether with Polyethylene Glycol nonionic surfactant), Zonyl® FSN-100, Zonyl® FS-300, Zonyl® FS-500, Zonyl® FS-510, Zonyl® FS-610, Zonyl® FSP, and Zonyl® UR. Other non-ionic surfactants include the amine condensates, such as cocoamide DEA and cocoamide MEA, sold under the trade name ULTRAFAX. Other classes of nonionic surfactants include acid ethoxylated fatty acids (polyethoxy-esters) comprising a fatty acid esterified with a polyether group typically comprising between about 1 and about 60 EO repeat units, such as between about 1 and about 40 EO repeat units, such as about 25 EO repeat units, 30 EO repeat units, 36 EO repeat units, or 40 EO repeat units. Glycerol esters comprise one, two, or three fatty acid groups on a glycerol base. Exemplary such surfactants include Cremophor® EL available from BASF and the Emulsogen EL series, including Emulsogen EL, Emulsogen EL-250, Emulsogen EL-300, and Emulsogen EL-400, available from Clariant. Yet another class of nonionic surfactants includes alkyl polyglucosides, such as Triton BG-10 and Triton CG-110, available from Dow Chemical.

The surfactant can be present in the electroplating bath at a concentration between about 0.1 g/L and about 50 g/L, preferably between about 5 g/L and about 20 g/L.

The aqueous composition for use in the method of the present invention may further contain agents for pH adjustment and buffering agents. The pH is typically controlled by one or more pH adjusters and typically contains a pH buffer to stabilize the pH within the desired pH range. In one embodiment, the desired pH range is between about 8 and about 13, such as between about 9.5 and about 12. Exemplary agents for alkaline pH adjustment include potassium hydroxide (KOH), tetramethylammonium hydroxide (TMAH), tetraethylammonium hydroxide (TEAOH), tetrapropylammonium hydroxide (TPA), tetrabutylammonium hydroxide (TBAOH), MTEOH, ETEOH, BTEOH, ammonia, and other amines. Exemplary agents for acidic pH adjustment include hydrochloric acid, sulfuric acid, phosphoric acid, and organic acids, such as citric acid and acetic acid, among others. Exemplary buffering agents include, for example, borates, tetra- and pentaborates, phosphates, ammonia, and hydroxyl amines such as monoethanolamine, diethanolamine, triethanolamine, and ethylenediamine, among others. The concentration of the ph adjustment agent and buffering agent is typically chosen to be sufficient to attain the desired pH and to maintain the desired pH within a relatively narrow range of about ±1 pH unit during surface oxide reduction. Typically, the total concentration of pH adjustment agents/buffering agents is between about 1 g/L and about 200 g/L, preferably between about 10 g/L and about 100 g/L.

Complexing agents may also be added to the reducing agent solution to complex free metal ions that may dissolve from the barrier layer material. Examples of complexing agents include ethylenediaminetetraacetic acid (EDTA), hydroxy lower alkyl lower alkylene amines, diamines, triamines and other polyamines or imines, such as tetra-2-hydroxypropyl ethylene diamine (EDTP); lower alkyl carboxylic acid lower alkylene amines, diamines, triamines or polyamines or imines, such as diethylene triamine pentaacetic acid; compounds which have attributes of the foregoing two classes of compounds, e.g., hydroxyalkyl or alkylene carboxylic acid amines, triamines, polyamines or imines, such as N-2-hydroxyethyl ethylene diamine-N,N',N'-triacetic acid; hydroxy mono-, di-, tri- or tetra-carboxylic acids, having, for example, 1 to 6 carbon atoms other than in the carboxylic groups, e.g., gluconate and glucoheptonate; nitrilotriacetic acid; glycolic acid; iminodiacetic acid; polyimines; and ethanolamine. These may be present in a concentration between about 0.1 g/L and about 50 g/L, preferably between about 5 g/L and about 20 g/L.

A wafer substrate comprising interconnect features having a barrier layer thereon may be cleaned by exposing the substrate to the reducing agent composition. This exposure may comprise dip, flood immersion, spray, or other manner of exposing the substrate to the reducing agent composition, with the provision that the manner of exposure adequately achieves the objectives of wetting down to the bottoms of the features and of reducing surface oxides present on the barrier layer material. Exposure typically occurs at a composition temperature between about 20° C. and about 90° C., preferably between about 50° C. and about 75° C. The duration of exposure for adequate surface cleaning may be between about 30 seconds and about 10 minutes, typically between about 1 minute and about 3 minutes. Exposure at these temperatures and durations are sufficient to reduce a surface oxide layer on a ruthenium substrate that may vary between about 5 Angstroms and about 100 Angstroms in thickness, such as between about 10 Angstroms and about 50 Angstroms. These oxide layer thicknesses are typical for a ruthenium substrate exposed to the ambient atmosphere for up to 9 months.

In one embodiment, after treatment in the above-described aqueous composition comprising a reducing agent, the substrate may be exposed to a separate composition for depositing copper metal into the bottom and the sidewall of the interconnect feature having the barrier layer or liner thereon. In one embodiment, the substrate may be exposed to a separate electroless copper deposition composition to deposit a copper seed layer on the barrier layer by electroless deposition. This may be followed by exposing the substrate to a separate electrolytic copper deposition composition, and followed by electrolytic copper deposition to fill the feature. In one preferred embodiment, the barrier layer comprises a seed layer of ruthenium, which is exposed to the aqueous composition comprising a reducing agent, followed by exposure to a separate electroless copper deposition composition to then plate with copper electrolessly, and finally, the feature is exposed to a separate electrolytic copper deposition composition so that it may be filled by electrolytic copper plating. In yet another embodiment, the barrier layer comprises a seed layer of ruthenium, which is exposed to the aqueous composition comprising a reducing agent, and the substrate is exposed to a separate electroless copper deposition composition to metallize the entire interconnect feature by electroless copper deposition. In yet another embodiment, the barrier layer comprises a seed layer of ruthenium, which is exposed to the aqueous composition comprising a reducing agent, followed by exposure to a separate copper deposition composition to then plate with copper electrolessly, and finally, the feature filled by electrolytic copper plating from the same copper deposition composition used for electroless copper deposition.

Electroless copper deposition chemistry is disclosed in, for example, U.S. Pat. No. 4,617,205 and U.S. Pat. No. 6,897,152, which are incorporated herein as if set forth in their entireties. As disclosed therein, the electroless copper deposition composition comprises a source of copper ions, a pH adjusting agent/buffer, a reducing agent, and other, optional bath components. As disclosed therein, the copper deposition chemistry may be used in both electroless and electrolytic plating operations.

Applicable copper sources may be selected from the group consisting of copper methanesulfonate, copper sulfate, copper chloride, copper acetate, copper nitrate, copper carbonate, copper hydroxide, copper iodide, and hydrates of the foregoing compounds. In a particularly preferred embodiment of the present invention the copper-containing compound is copper (II) sulfate pentahydrate ($CuSO_4.5H_2O$). The concentration of copper ions in the solution is preferably between about 0.008 and about 1 M, and more preferably between about 0.02 and about 0.5 M. Thus, the amount of copper(II) sulfate pentahydrate in the copper plating solution is preferably between about 2 and about 200 g/L, and more preferably between about 5 and about 150 g/L.

The electroless copper deposition composition comprises a reducing agent that reduces the copper(II) ions to copper metal to enable electroless plating. The reducing agent may be selected from glyoxylic acid, borane-based reducing agents, hypophosphite, or hydrazine. Borane-based reducing agents include borohydrides (sodium, potassium, cyano, trimethoxy, and tetramethylammonium, among others), monomethyl amine borane, isopropyl amine borane, dimethyl amine borane (DMAB), diethyl amine borane (DEAB), trimethyl amine borane, triethyl amine borane, triisopropyl amine borane, pyridine borane, morpholine borane. The concentration of the borane-based reducing agent may vary between about 2 g/L and about 100 g/L. Phosphorus-based reducing agents include hypophosphorus acid, ammonium hypophosphite, sodium hypophosphite, and potassium hypophosphite. The concentration of the phosphorus-based reducing agent may vary between about 5 g/L and about 200 g/L. Examples of sources of hydrazine include hydrazine, hydrazine hydrate, hydrazine sulfate, hydrazine chloride, hydrazine bromide, hydrazine dihydrochloride, hydrazine dihydrobromide and hydrazine tartrate. These sources are preferred in certain embodiments of the invention because they provide hydrazine directly upon dissolution. Other suitable sources of hydrazine include 2-hydrazinopyridine, hydrazobenzene, phenyl hydrazine, hydrazine-N,N-diacetic acid, 1,2-diethylhydrazine, monomethylhydrazine, 1,1-, 1,2-dimethylhydrazine, 4-hydrazinobenzenesulfonic acid, hydrazinecarboxylic acid, 2-hydrazinoethanol, semicarbazide, carbohydrazide, aminoguanidine hydrochloride, 1,3-diaminoguanidine monohydrochloride, and triaminoguanidine hydrochloride. These sources provide hydrazine as a reaction product. The concentration of the hydrazine reducing agent may vary between about 1 g/L and about 40 g/L. A preferred reducing agent is glyoxylic acid or a glyoxylate salt, such as sodium glyoxylate monohydrate. The concentration of the glyoxylic acid in the solution may be between about 0.027 and about 0.27 M (between about 2 and about 20 g/L). In another preferred embodiment, the concentration of the glyoxylic acid is between about 0.07 and about 0.14 M (between about 5 and about 10 g/L).

Hydroxide ions are included in the plating solution to neutralize the hydrogen ions ($H^+$) generated, e.g., by the copper compounds, the complexing agent, and the reducing agent. Additionally, the hydroxide ions participate in the chemical reduction of the copper ions to copper metal. Applicable hydroxide sources include ammonium hydroxide, diethyldimethylammonium hydroxide, triethylmethylammonium hydroxide, tetramethyl ammonium hydroxide, tetraethyl ammonium hydroxide, NaOH, KOH, LiOH, etc. The bath preferably does not contain any mobile ions such as alkali metal ions and alkaline earth metal ions which may be critical contaminants for CMOS devices, thus, any other hydroxide-containing compounds included in the solution are preferably substantially free of alkali metal or alkaline earth metal atoms and/or ions (i.e., the compounds of the solution do not contain more than the typical impurity level of alkali metal or alkaline earth metal atoms and/or ions for electronics grade materials). The concentration of hydroxide source is preferably between about 0.39 and about 2.64 M, such as between about 1.20 and about 2.20 M (between about 110 and about 200 g/L). Typically, the pH of the solution is between about 10 and about 14. In one embodiment, the pH of the solution is between about 12.5 and about 13.

The complexing agent is included in the plating solution to prevent the precipitation of copper oxides, copper hydroxides, and insoluble copper salts (e.g., copper oxalate). Preventing the precipitation of copper oxalate is significant because when glyoxylic acid functions as a reducing agent it is oxidized to oxalic acid which can result in a build-up of oxalate ions when the bath is in use. If formed in the plating solution, such precipitates may deposit on the substrate, become incorporated in the copper plate, and result in a rough surface. If the concentration of precipitates is great enough, the layer deposited on the substrate can be powdery and not adhere to the substrate. In general, the complexing agent is capable of forming stable, water-soluble copper complexes under conditions of high pH (e.g., a pH of 12 and higher) and high temperature (e.g., up to boiling). The complexing agent also keeps the concentration of free copper ions low, which tends to prevent decomposition of the bath. The preferred complexing agent is ethylenediaminetetraacetic acid (EDTA), however, other complexing agents may be used with, or in place of, EDTA. Examples of other complexing agents include: hydroxy lower alkyl lower alkylene amines, diamines, triamines and other polyamines or imines, such as tetra-2-hydroxypropyl ethylene diamine (EDTP); lower alkyl carboxylic acid lower alkylene amines, diamines, triamines or polyamines or imines, such as diethylene triamine pentaacetic acid; compounds which have attributes of the foregoing two classes of compounds, e.g., hydroxyalkyl or alkylene carboxylic acid amines, triamines, polyamines or imines, such as N-2-hydroxyethyl ethylene diamine-N,N',N'-triacetic acid; hydroxy mono-, di-, tri- or tetra-carboxylic acids, having, for example, 1 to 6 carbon atoms other than in the carboxylic groups, e.g., gluconate and glucoheptonate; nitrilotriacetic acid; glycolic acid; iminodiacetic acid; polyimines; and ethanolamine.

Any appropriate EDTA-containing compound may be used to supply the EDTA. For example, the EDTA may be supplied as the acid itself and as EDTA-containing salts such as EDTA-(mono, di, tri, or tetra)-(sodium, potassium, or ammonium) salts. Preferably, the EDTA is supplied as the acid itself. The concentration of EDTA in the solution is preferably between about 0.012 and about 0.12 M (between about 3 and about 30 g/L). More preferably, the concentration of EDTA is between about 0.04 and about 0.08 M (between about 10 and about 20 g/L). To ensure the efficient plating of copper, the concentrations of the copper ions and the EDTA are preferably controlled so that the molar ratio of copper to EDTA is between about 1:1 and about 1:2, and more preferably between about 1:1 and about 1:1.5.

The plating solution may also comprise one or more stabilizer compounds to stabilize the solution and control the plating rate during electroless deposition. A stabilizer compound typically forms strong copper (I) complexes that tend to inhibit the formation of copper (I) oxide. In one embodiment, the plating solution comprises 2,2'-bipyridyl as a stabilizer compound. The concentration of 2,2' bipyridyl in the copper plating solution is preferably between about 0.006 and about 0.128 mM (between about 1 and about 20 g/l). More preferably, the concentration of 2,2'-bipyridyl in the copper plating solution is between about 0.006 and about 0.064 mM (between about 1 and about 10 mg/l). The 2,2'-bipyridyl may be supplied to the solution as itself and/or by an appropriate organic nitrogen-containing compounds such as hydroxypyridine and 2,2'-dipyridylamine. A further reason for including a stabilizer is that they can be used to control the electroless plating rate. For example, 2,2' bipyridyl tends to enhance the plating rate during electroless deposition.

During a plating operation, the copper plating solution is preferably maintained at a temperature between about 20° C. and about 90° C., and more preferably between about 60° C. and about 80° C. The copper plating solution preferably electrolessly plates at a rate between about 6 nm/hr and about 6 μm/hr. As such, to deposit copper on a substrate by electroless deposition, the substrate is typically immersed in, or contacted with, the copper plating solution for a duration that is between about 10 seconds and about 10 minutes. More preferably, the substrate is immersed in the solution for a duration between about 10 and about 60 seconds.

In another embodiment, electroless copper deposition may be followed by electrolytic copper deposition using superfilling chemistry, such as, for example, ViaForm®, available from Enthone Inc. (West Haven, Conn.). These chemistries employ a source of copper ions, a leveler, and accelerator, and a suppressor.

Sources of copper ions include copper sulfate, copper sulfate pentahydrate, copper oxide, copper carbonate, copper fluoroborate, copper pyrophosphate, copper cyanide, copper phosphonate, and other copper metal complexes such as copper methane sulfonate. In one embodiment, the copper source is one of the copper sulfate-based sources, namely, copper sulfate or copper sulfate pentahydrate. In another embodiment, the copper source is copper methane sulfonate. The copper ion concentration of copper typically ranges from about 5 g/L to about 150 g/L, while the acid concentration may range from about 5 g/L to about 300 g/L.

The composition of the invention also preferably includes a leveler which has an enhanced leveling effect without substantially interfering with superfilling of Cu into high aspect ratio features. One such preferred leveler is disclosed in U.S. Pat. Pub. No. 2005/0045488, filed Oct. 12, 2004, the entire disclosure of which is expressly incorporated by reference. This leveler does not substantially interfere with superfilling, so the Cu bath can be formulated with a combination of accelerator and suppressor additives which provides a rate of growth in the vertical direction which is substantially greater than the rate of growth in the horizontal direction, and even more so than in conventional superfilling of larger interconnects. One such preferred leveler is a reaction product of 4-vinyl pyridine and methyl sulfate available from Enthone Inc. under the trade name ViaForm L700. The leveler is incorporated, for example, in a concentration between about 0.1 mg/L and about 25 mg/L. Another is the reaction product of 4-vinyl pyridine and 1,3 dichloropropanol according to example 20 of 2005/0045488, which is the leveler employed in below example 4.

With regard to accelerators, in a system currently preferred by the applicants, the accelerators are bath soluble organic divalent sulfur compounds as disclosed in U.S. Pat. No. 6,776,893, the entire disclosure of which is expressly incorporated by reference. In one preferred embodiment, the accelerator corresponds to the structure (1):

$$R_1—(S)_n RXO_3 M \quad (1)$$

wherein

M is hydrogen, alkali metal or ammonium as needed to satisfy the valence;

X is S or P;

R is an alkylene or cyclic alkylene group of 1 to 8 carbon atoms, an aromatic hydrocarbon or an aliphatic aromatic hydrocarbon of 6 to 12 carbon atoms;

n is 1 to 6; and $R_1$ is $MO_3 XR$ wherein M, X and R are as defined above.

An accelerator which is especially preferred is 1-propanesulfonic acid, 3,3'-dithiobis, disodium salt according to the following structure (2):

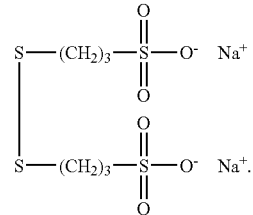

Structure (2)

The accelerator is incorporated typically in a concentration between about 0.5 and about 1000 mg/L, more typically between about 2 and about 50 mg/L, such as between about 5 and 30 mg/L. A significant aspect of the current invention is that it permits the use of a greater concentration of accelerator, and in many applications in fact it must be used in conjunction with a greater concentration of accelerator than in conventional processes. This permits achieving the enhanced rates of superfilling demonstrated below.

Optionally, additional leveling compounds of the following types can be incorporated into the bath such as the reaction product of benzyl chloride and hydroxyethyl polyethylenimine as disclosed in U.S. Pat. Pub. No. 2003/0168343, the entire disclosure of which is expressly incorporated herein by reference.

Suppressors may be of the type disclosed in U.S. Pat. No. 7,303,992 and U.S. Pub. No. 2007/0178697. Suppressors typically comprise a polyether group covalently bonded to a base moiety. One class of applicable suppressors comprises a polyether group covalently bonded to an amine moiety. Another class of applicable suppressors comprises a polyether group covalently bonded to an alcohol initiating moiety. These suppressor compounds described above can be present in an overall bath concentration between about 10 mg/L to about 1000 mg/L, preferably between about 50 mg/L to about 200 mg/L.

Chloride ion may also be used in the bath at a level up to 200 mg/L, preferably about 10 to 90 mg/L. Chloride ion is added in these concentration ranges to enhance the function of other bath additives. Other additives (usually organic additives) may be employed for grain refinement, suppression of dendritic growth, and improved covering and throwing power. Typical additives used in electrolytic plating are discussed in a number of references including Modern Electroplating, edited by F. A. Lowenheim, John Reily & Sons, Inc., 1974, pages 183-203.

Electrolytic plating conditions such as electric current concentration, applied voltage, electric current density, and solution temperature are essentially the same as those in conventional electrolytic Cu plating methods. For example, the bath temperature is typically about room temperature such as about 20-27° C., but may be at elevated temperatures up to about 40° C. or higher. The electrical current density is typically up to about 20 A/dm$^2$, more typically up to about 10 A/dm$^2$, typically from about 0.2 A/dm$^2$ to about 6 A/dm$^2$. It is preferred to use an anode to cathode ratio of about 1:1, but this may also vary widely from about 1:4 to 4:1. The process also uses mixing in the electrolytic plating tank which may be supplied by agitation or preferably by the circulating flow of recycle electrolytic solution through the tank. The flow through the electrolytic plating tank provides a typical residence time of electrolytic solution in the tank of less than about 1 minute, more typically less than 30 seconds, e.g., 10-20 seconds.

By metallizing features according to the method of the present invention, smooth, uniform, and continuous copper layers may be deposited on top of a variety of barrier layers. It has been discovered that surface roughness may be controlled according to the method of the present invention due to uniform nucleation and growth. By pre-treating barrier layers using the reducing agent composition of the invention, copper nucleation is more uniform, leading to a smoother as-deposited copper layer having good appearance characteristics. Moreover, void-free and defect-free filling may be achieved, particularly at the copper/barrier layer interface. It is further possible, in one embodiment, to deposit a copper seeding layer by an electroless deposition method followed by electrolytic copper deposition for "bottom-up" gapfill of vias with critical dimensions of 60 nm. Void-free filling of the vias may be achieved, in another embodiment, by electroless copper deposition alone.

Moreover, induction times of copper growth using electroless copper deposition methods on the pre-treated barrier layers are reduced. Whereas induction is inhibited and in some cases prevented on barrier layers having surface metal oxides, induction times are reduced on surfaces that are pre-treated with the reducing agent composition of the invention. By pre-treating the barrier layer with the reducing agent composition prior to copper metallization, induction of copper growth, either electroless, in the barrier layer is typically less than 50 seconds, less than 40 seconds, less than 30 seconds, less than 20 seconds, and even less than 10 seconds, such as 9 seconds, 8 seconds, 7 seconds, 6 seconds, and even less than 5 seconds in some embodiments.

Having described the invention in detail, it will be apparent that modifications and variations are possible without departing from the scope of the invention defined in the appended claims.

EXAMPLES

The following non-limiting examples further illustrate the present invention.

Example 1

Pre-Treatment Composition

A pre-treatment composition was prepared to contain the following components and approximate concentrations:
Dimethylamine Borane (100 g/L)
CALFOAM® EA-603 (100 g/L)
Balance water 1 liter.

Example 2

Pre-Treatment Composition

A pre-treatment composition was prepared to contain the following components and approximate concentrations:
Hypophosphorous acid (20 g/L)
Dimethyl amine Borane (2 g/L)
Diethylamine (20 g/L)
Balance water 1 liter.

Example 3

Study of Induction Time of Electroless Copper Deposition on Various Seed Layers

The induction time of electroless copper deposition on ruthenium seed layers treated with the composition of Example 1 were measured using open-circuit potential change with time using a potentiostat and Standard Calomel Electrode (SCE) on blanket substrates.

FIG. 1 is a graph showing the induction time of electroless copper deposition on ruthenium substrates (freshly prepared and aged) compared to that on a PVD copper substrate. Electroless copper deposition was rapidly initiated on freshly prepared ruthenium substrates and on the copper surface. A ruthenium surface aged for 9 months in air (humidity was not controlled) exhibited delay deposition initiation (over 100 seconds), which is thought to be due to oxidation of the ruthenium surface. In some cases, electroless copper deposition did not initiate on aged ruthenium surfaces.

The aged ruthenium substrate was pre-treated prior to electroless copper deposition using the pre-treatment composition of Example 1. The aged ruthenium substrate was pre-treated by immersing it in the composition at a temperature of 65° C. to reduce surface oxides. After pre-treatment in the composition of Example 3, the induction time (less than 10 seconds) of electroless copper deposition on the aged substrate was similar to that of the freshly prepared ruthenium surfaces. For slightly oxidized ruthenium surfaces deposited by PVD (a few weeks exposure to the air), pre-clean is not needed for uniform initiation, which is presumably due to "in-situ" ruthenium surface oxides reduction prior to copper initiation.

Figure 2A:
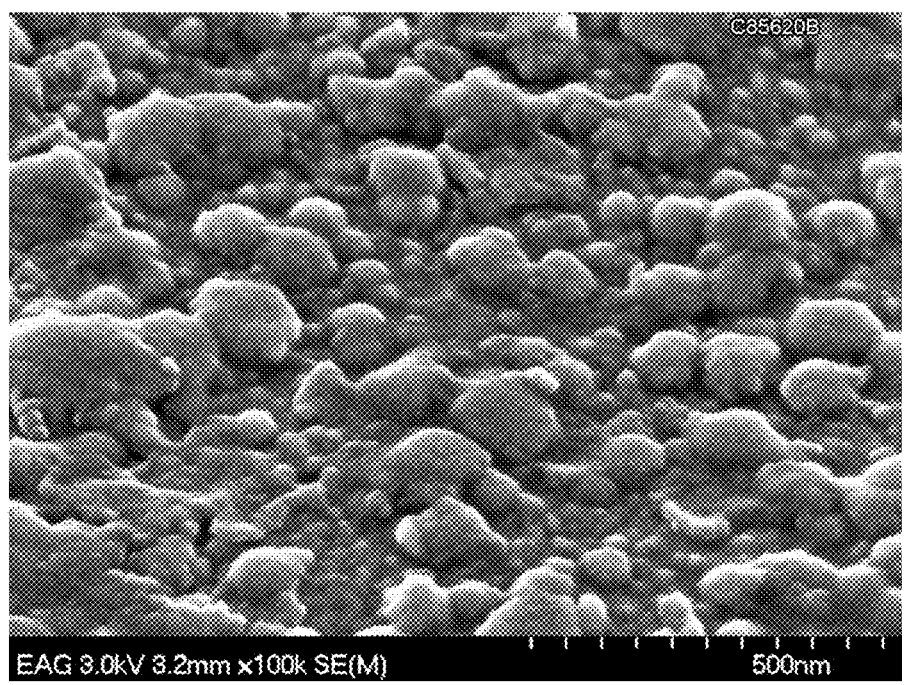
FIGS. 2A and 2B are SEM images of electrolytic copper deposited on ruthenium substrates. The substrates were treated according to the method described in Example 3.
Figure 2B:
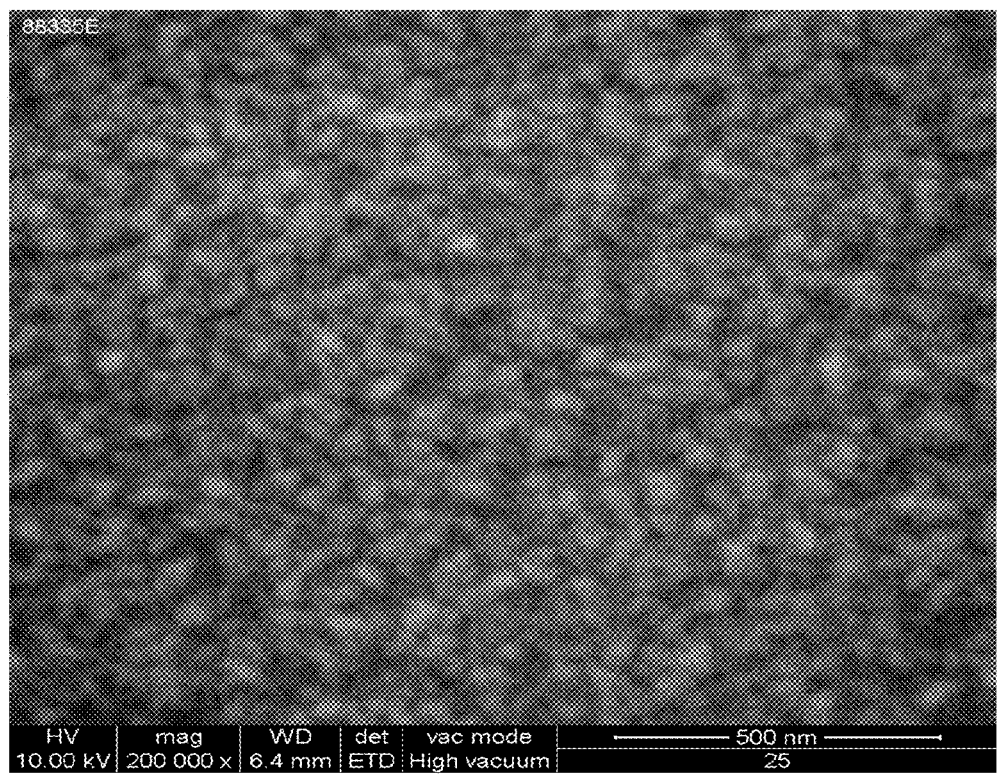

The induction time delay of copper growth on aged ruthenium substrates may result from ruthenium oxide. FIGS. 2A and 2B are SEM images of electrolytically deposited copper deposited on aged ruthenium surfaces. The thicknesses of the copper deposits are about 200 nm. FIG. 2A depicts the roughness of the copper deposit on an aged ruthenium surface that was not pre-treated according to the method of the present invention. FIG. 2B depicts a relatively smoother copper deposit on an aged ruthenium surface that was pre-treated according to the method of the present invention. FIG. 2A shows a surface characterized by a high degree of roughness, caused by isolated copper growth initiation and longer induction times. Copper nucleation does not completely cover the underlying ruthenium deposit until the copper deposit it at least 20 nm thick. FIG. 2B, on the other hand, shows a smooth, uniform surface in which copper growth nucleation was highly dense. In this case, the ruthenium substrate was covered with copper deposit at a deposit thickness of less than 5 nm.

Figure 3A:
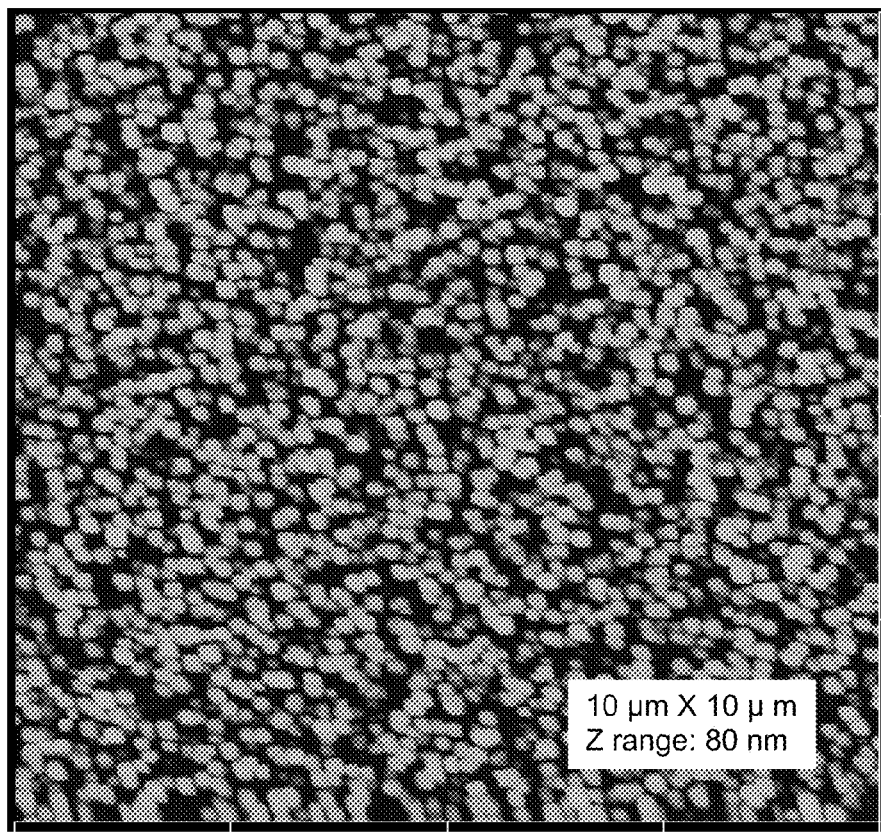
FIGS. 3A and 3B are AFM images of electrolytic copper deposited on ruthenium substrates. The substrates were treated according to the method described in Example 3.
Figure 3B:
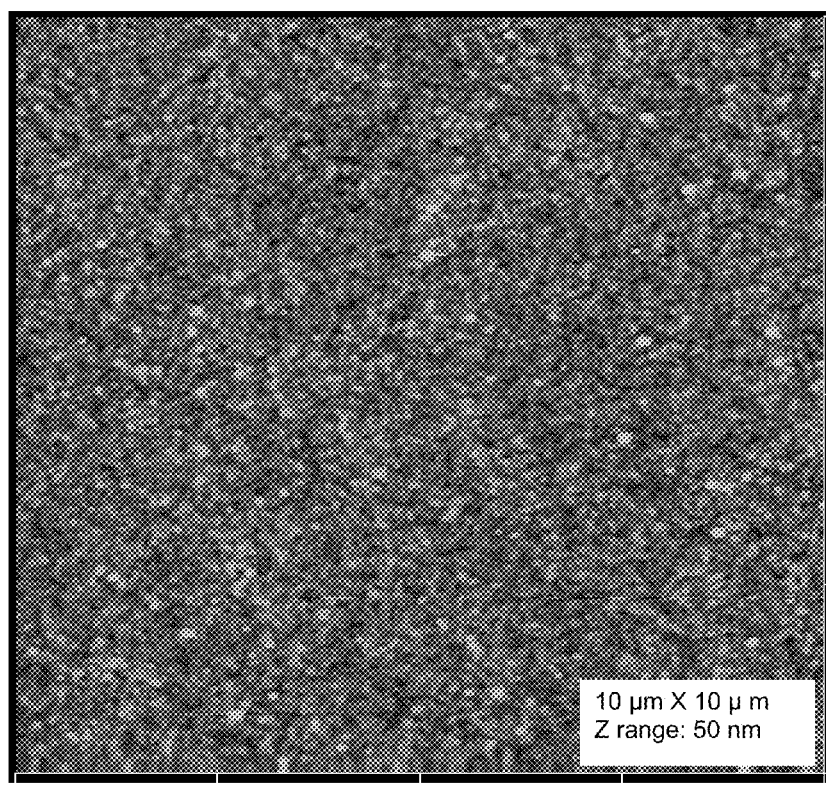

FIGS. 3A and 3B are AFM (atomic force microscopy) images of electrolytically plated copper up to a thickness of about 200 nm on a substrate that was not pre-treated according to the method of the present invention (FIG. 3A) and on a substrate that was pre-treated according to the method of the present invention (FIG. 3B). The copper deposit shown in FIG. 3A had a roughness (RMS) of 90 nm±16 nm, a dark brown appearance and poor uniformity. The copper deposit shown in FIG. 3B had a roughness (RMS) of 14.5 nm±0.8 nm, was bright in appearance and exhibited good uniformity.

Figure 4:
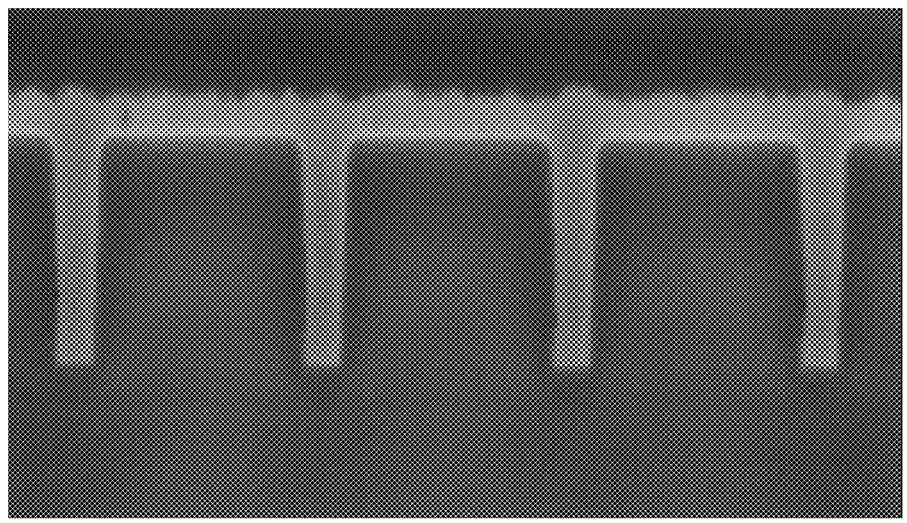
FIG. 4 is a SEM cross-section image of completely filled vias using electrolytic copper deposition following an electroless copper seeding layer over aged ALD ruthenium. The aged ALD ruthenium was pre-cleaned prior to electroless copper deposition. The image was obtained according to the method of Example 3.

FIG. 4 is a SEM cross-section image of completely filled vias using electrolytic copper deposition following an electroless copper seeding layer over an aged ALD ruthenium surface. The vias have 60 nm diameter openings. The thickness of the electroless copper seed layer was approximately 2 nm, measured by XRF. Electroless copper seeding enabled "bottom-up" filling by electrolytic deposition. Void-free filling was achieved.

Figure 5:
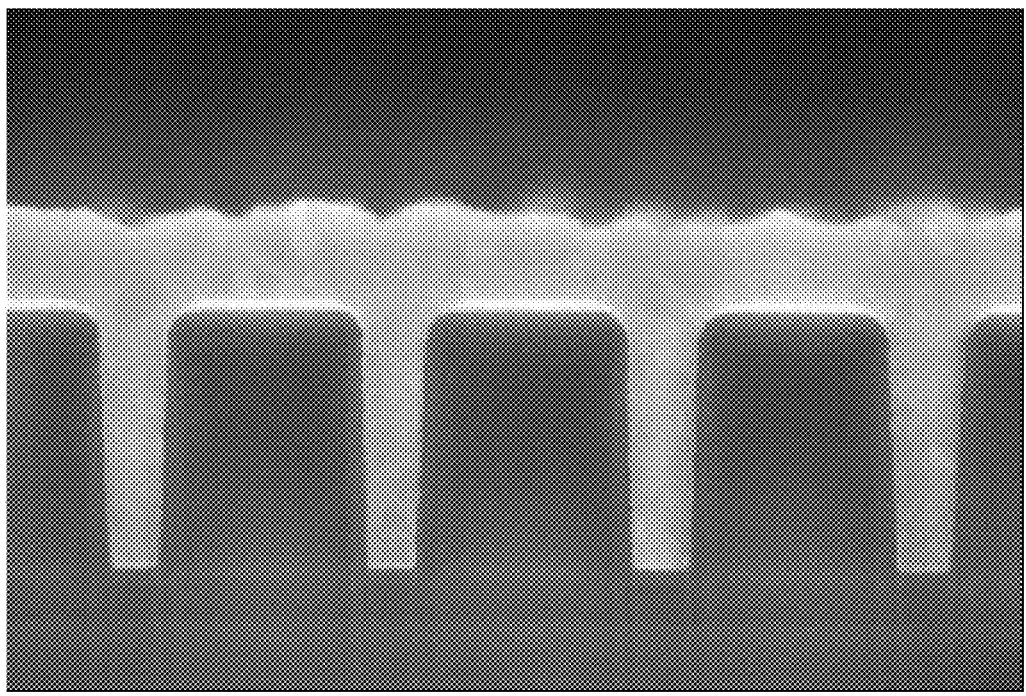
FIG. 5 is a SEM cross-section image of vias filled solely by electroless copper deposition over aged ALD ruthenium. The aged ALD ruthenium was pre-cleaned prior to electroless copper deposition. The image was obtained according to the method of Example 3.

FIG. 5 is a SEM cross-section image of vias filled solely by electroless copper deposition over an aged ALD ruthenium surface. The vias have 60 nm diameter openings. Seamless fill was achieved for this particular via structures. No voids were obtained at the Cu/Ru interfaces.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above compositions and processes without departing from the scope of the invention, it is intended that all matter contained in the above description and shown in the accompanying drawing[s] shall be interpreted as illustrative and not in a limiting sense.

What is claimed is:

1. A method of metallizing a substrate comprising an interconnect feature in the manufacture of a microelectronic device, wherein the interconnect feature comprises a bottom, a sidewall, and a top opening having a diameter, D, the method comprising:
   depositing a barrier layer on the bottom and the sidewall of the interconnect feature, the barrier layer comprising a metal selected from the group consisting of ruthenium, tungsten, tantalum, titanium, iridium, rhodium, and combinations thereof;
   contacting the substrate comprising the interconnect feature comprising the bottom and sidewall having the barrier layer thereon with an aqueous composition comprising a reducing agent for removal of oxide that may have formed on the surface of the barrier metal; and
   after contact of said substrate with said aqueous solution, depositing copper metal onto the bottom and the sidewall of the interconnect feature having the barrier layer thereon.

2. The method of claim 1 wherein the barrier layer comprises ruthenium, and the barrier layer is deposited by chemical vapor deposition.

3. The method of claim 1 wherein the barrier layer comprises ruthenium, and the barrier layer is deposited by physical vapor deposition.

4. The method of claim 1 wherein the barrier layer comprises ruthenium, and the barrier layer is deposited by atomic layer deposition.

5. The method of claim 1 wherein the barrier layer comprises an underlayer comprising a material selected from the group consisting of ruthenium, tungsten, tantalum, tantalum nitrogen composite, titanium, titanium nitrogen composite, tungsten, and tungsten nitrogen composite, and ruthenium, and a surface layer comprising a material selected from the group consisting of ruthenium, tungsten, iridium, rhodium, platinum, and combinations thereof.

6. The method of claim 5 wherein the surface layer comprises ruthenium, and the surface layer is deposited by chemical vapor deposition.

7. The method of claim 5 wherein the surface layer comprises ruthenium, and the surface layer is deposited by physical vapor deposition.

8. The method of claim 5 wherein the surface layer comprises ruthenium, and the surface layer is deposited by atomic layer deposition.

9. The method of claim 1 wherein the reducing agent is selected from the group consisting of borohydrides (sodium, potassium, cyano, trimethoxy, and tetramethylammonium, among others), monomethyl amine borane, isopropyl amine borane, tert-butylamine borane, dimethyl amine borane (DMAB), diethyl amine borane (DEAB), trimethyl amine borane, triethyl amine borane, triisopropyl amine borane, pyridine borane, morpholine borane, 4-methylmorpholine borane, hypophosphorus acid, ammonium hypophosphite, sodium hypophosphite, sodium hypophosphite monohydrate, potassium hypophosphite, tetramethylammonium hypophosphite, tetraethylammonium hypophosphite, tetrapropylammonium hypophosphite, tetrabutylammonium hypophosphite, calcium hypophosphite, manganese hypophosphite, 1-ethylpiperidine hypophosphite, anilinium hypophosphite, and combinations thereof.

10. The method of claim 1 wherein the reducing agent comprises a first reducing agent component and a second reducing agent component, wherein:
   the first reducing agent component is selected from the group consisting of borohydrides (sodium, potassium, cyano, trimethoxy, and tetramethylammonium, among others), monomethyl amine borane, isopropyl amine borane, tert-butylamine borane, dimethyl amine borane (DMAB), diethyl amine borane (DEAB), trimethyl amine borane, triethyl amine borane, triisopropyl amine borane, pyridine borane, morpholine borane, 4-methylmorpholine borane, and combinations thereof; and
   the second reducing agent component is selected from the group consisting of hypophosphorus acid, ammonium hypophosphite, sodium hypophosphite, sodium hypophosphite monohydrate, potassium hypophosphite, tetramethylammonium hypophosphite, tetraethylammonium hypophosphite, tetrapropylammonium hypophosphite, tetrabutylammonium hypophosphite, calcium hypophosphite, manganese hypophosphite, 1-ethylpiperidine hypophosphite, anilinium hypophosphite, and combinations thereof.

11. The method of claim 1 wherein the aqueous composition comprising a reducing agent has a pH between about 8 and about 13.

12. The method of claim 1 wherein the aqueous composition further comprises a surfactant.

13. The method of claim 12 wherein the surfactant is an anionic surfactant selected from the group consisting of alkyl phosphonates, alkyl ether phosphates, alkyl sulfates, alkyl ether sulfates, alkyl sulfonates, alkyl ether sulfonates, carboxylic acid ethers, carboxylic acid esters, alkyl aryl sulfonates, aryl alkylether sulfonates, aryl sulfonates, sulfosuccinates, and combinations thereof.

14. The method of claim 12 wherein the surfactant is selected from the group consisting of sodium lauryl sulfate, sodium laureth sulfate (1 EO), sodium laureth sulfate (2 EO), sodium laureth, sodium laureth sulfate (3 EO), ammonium lauryl sulfate, ammonium laureth sulfate, ammonium laureth sulfate (3 EO), TEA-lauryl sulfate, TEA-laureth sulfate, MEA-lauryl sulfate, MEA-laureth sulfate, potassium lauryl sulfate, potassium laureth sulfate, sodium decyl sulfate, sodium octyl/decyl sulfate, sodium 2-ethylhexyl sulfate, sodium octyl sulfate, sodium nonoxynol-4 sulfate, sodium nonoxynol-6 sulfate, sodium cumene sulfate, ammonium nonoxynol-6 sulfate, polyether sulfates, and combinations thereof.

15. The method of claim 12 wherein the surfactant is selected from the group consisting of sodium α-olefin sulfonate, ammonium xylene sulfonate, sodium xylene sulfonate, sodium toluene sulfonate, dodecyl benzene sulfonate, lignosulfonates, disodium lauryl sulfosuccinate, disodium laureth sulfosuccinate, and combinations thereof.

16. The method of claim 1 wherein the copper metal is deposited by contacting the substrate with an electroless copper deposition composition to thereby deposit the copper metal by electroless copper deposition.

17. The method of claim 1 wherein the copper metal is deposited by contacting the substrate with an electrolytic copper deposition composition and applying an external source of electrons to thereby deposit the copper metal by electrolytic copper deposition.

18. The method of claim 1 wherein the copper metal is deposited according to the following steps in order (1) contacting the substrate with an electroless copper deposition composition to thereby deposit the copper metal by electroless copper deposition (2) contacting the substrate with an electrolytic copper deposition composition and (3) applying an external source of electrons to thereby deposit the copper metal by electrolytic copper deposition.

19. A method of metallizing an interconnect feature in a microelectronic device substrate, wherein the interconnect feature comprises a bottom, a sidewall, and a top opening having a diameter, D, the method comprising:
depositing a barrier layer on the bottom and the sidewall of the interconnect feature, the barrier layer comprising a metal selected from the group consisting of ruthenium, tungsten, tantalum, titanium, iridium, rhodium, and combinations thereof;
contacting the substrate comprising the interconnect feature comprising the bottom and sidewall having the barrier layer thereon with an aqueous composition comprising a reducing agent for removal of oxide that may have formed on the surface of the barrier metal; and
after contact of said substrate with said aqueous solution, contacting the substrate with an electroless copper deposition composition to electrolessly deposit copper metal in the interconnect feature and thereby metallize the interconnect feature.

20. A method as set forth in claim 1 wherein an oxide that has formed on said barrier layer is removed by contact of said substrate comprising said barrier with said aqueous solution containing a reducing agent.

21. A method as set forth in claim 1 wherein said substrate comprising the interconnect feature comprising the bottom and sidewall having the barrier layer thereon is contacted with an aqueous composition comprising a reducing agent for removal of oxide that may have formed on the surface of the barrier layer due to exposure to ambient atmosphere.

22. A method as set forth in claim 19 wherein said substrate comprising the interconnect feature comprising the bottom and sidewall having the barrier layer thereon is contacted with an aqueous composition comprising a reducing agent for removal of oxide that may have formed on the surface of the barrier layer due to exposure to ambient atmosphere.

23. A method of metallizing a substrate comprising an interconnect feature in the manufacture of a microelectronic device, wherein the interconnect feature comprises a bottom, a sidewall, and a top opening having a diameter, D, the method comprising:
contacting the substrate comprising the interconnect feature comprising the bottom and sidewall having the barrier layer thereon with an aqueous composition comprising a reducing agent for removal of oxide that may have formed on the surface of the barrier metal;
wherein said substrate prior to said contacting is characterized by having a deposited barrier layer on the bottom and the sidewall of the interconnect feature, and the barrier layer comprising a metal selected from the group consisting of ruthenium, tungsten, tantalum, titanium, iridium, rhodium, and combinations thereof; and
after contact of said substrate with said aqueous solution, depositing copper metal onto the bottom and the sidewall of the interconnect feature having the barrier layer thereon.

24. The method of claim 23 wherein the barrier layer comprises an underlayer comprising a material selected from the group consisting of ruthenium, tungsten, tantalum, tantalum nitrogen composite, titanium, titanium nitrogen composite, tungsten, and tungsten nitrogen composite, and ruthenium, and a surface layer comprising a material selected from the group consisting of ruthenium, tungsten, iridium, rhodium, platinum, and combinations thereof.

25. The method of claim 23 wherein the reducing agent is selected from the group consisting of borohydrides (sodium, potassium, cyano, trimethoxy, and tetramethylammonium, among others), monomethyl amine borane, isopropyl amine borane, tert-butylamine borane, dimethyl amine borane (DMAB), diethyl amine borane (DEAB), trimethyl amine borane, triethyl amine borane, triisopropyl amine borane, pyridine borane, morpholine borane, 4-methylmorpholine borane, hypophosphorus acid, ammonium hypophosphite, sodium hypophosphite, sodium hypophosphite monohydrate, potassium hypophosphite, tetramethylammonium hypophosphite, tetraethylammonium hypophosphite, tetrapropylammonium hypophosphite, tetrabutylammonium hypophosphite, calcium hypophosphite, manganese hypophosphite, 1-ethylpiperidine hypophosphite, anilinium hypophosphite, and combinations thereof.

26. The method of claim 23 wherein the reducing agent comprises a first reducing agent component and a second reducing agent component, wherein:

the first reducing agent component is selected from the group consisting of borohydrides (sodium, potassium, cyano, trimethoxy, and tetramethylammonium, among others), monomethyl amine borane, isopropyl amine borane, tert-butylamine borane, dimethyl amine borane (DMAB), diethyl amine borane (DEAB), trimethyl amine borane, triethyl amine borane, triisopropyl amine borane, pyridine borane, morpholine borane, 4-methyl-morpholine borane, and combinations thereof; and the second reducing agent component is selected from the group consisting of hypophosphorus acid, ammonium hypophosphite, sodium hypophosphite, sodium hypophosphite monohydrate, potassium hypophosphite, tetramethylammonium hypophosphite, tetraethylammonium hypophosphite, tetrapropylammonium hypophosphite, tetrabutylammonium hypophosphite, calcium hypophosphite, manganese hypophosphite, 1-ethylpiperidine hypophosphite, anilinium hypophosphite, and combinations thereof.

27. The method of claim 23 wherein the aqueous composition comprising a reducing agent has a pH between about 8 and about 13.

28. The method of claim 23 wherein the aqueous composition further comprises an anionic surfactant selected from the group consisting of alkyl phosphonates, alkyl ether phosphates, alkyl sulfates, alkyl ether sulfates, alkyl sulfonates, alkyl ether sulfonates, carboxylic acid ethers, carboxylic acid esters, alkyl aryl sulfonates, aryl alkylether sulfonates, aryl sulfonates, sulfosuccinates, and combinations thereof.

29. The method of claim 23 wherein the aqueous composition further comprises a surfactant selected from the group consisting of sodium lauryl sulfate, sodium laureth sulfate (1 EO), sodium laureth sulfate (2 EO), sodium laureth, sodium laureth sulfate (3 EO), ammonium lauryl sulfate, ammonium laureth sulfate, ammonium laureth sulfate (3 EO), TEA-lauryl sulfate, TEA-laureth sulfate, MEA-lauryl sulfate, MEA-laureth sulfate, potassium lauryl sulfate, potassium laureth sulfate, sodium decyl sulfate, sodium octyl/decyl sulfate, sodium 2-ethylhexyl sulfate, sodium octyl sulfate, sodium nonoxynol-4 sulfate, sodium nonoxynol-6 sulfate, sodium cumene sulfate, ammonium nonoxynol-6 sulfate, polyether sulfates, and combinations thereof.

30. The method of claim 23 wherein the aqueous composition further comprises a surfactant selected from the group consisting of sodium α-olefin sulfonate, ammonium xylene sulfonate, sodium xylene sulfonate, sodium toluene sulfonate, dodecyl benzene sulfonate, lignosulfonates, disodium lauryl sulfosuccinate, disodium laureth sulfosuccinate, and combinations thereof.

31. The method of claim 23 wherein the copper metal is deposited by contacting the substrate with an electroless copper deposition composition to thereby deposit the copper metal by electroless copper deposition.

32. The method of claim 23 wherein the copper metal is deposited by contacting the substrate with an electrolytic copper deposition composition and applying an external source of electrons to thereby deposit the copper metal by electrolytic copper deposition.

33. The method of claim 23 wherein the copper metal is deposited according to the following steps in order (1) contacting the substrate with an electroless copper deposition composition to thereby deposit the copper metal by electroless copper deposition (2) contacting the substrate with an electrolytic copper deposition composition and (3) applying an external source of electrons to thereby deposit the copper metal by electrolytic copper deposition.

* * * * *